United States Patent [19]

Crowley

[11] Patent Number: 4,459,559
[45] Date of Patent: Jul. 10, 1984

[54] PHASE FREQUENCY DETECTOR USING SHIFT REGISTER

[75] Inventor: Albert T. Crowley, Somerdale, N.J.

[73] Assignee: RCA Corporation, New York, N.Y.

[21] Appl. No.: 326,141

[22] Filed: Nov. 30, 1981

[51] Int. Cl.³ .................... H03D 13/00; H03L 7/18
[52] U.S. Cl. .................... 331/1 A; 331/8; 331/27; 331/DIG. 2; 328/134; 307/526
[58] Field of Search .................... 331/1 A, 25, 27; 328/133, 134; 307/525, 526, 514, 516

[56] References Cited

U.S. PATENT DOCUMENTS

| | | | |
|---|---|---|---|
| 3,714,463 | 1/1973 | Laune | 307/26 |
| 3,813,604 | 5/1974 | Denoncourt | 329/122 |
| 3,857,103 | 12/1974 | Grazia | 328/133 |
| 3,866,133 | 2/1975 | Debloois | 329/104 |
| 3,902,128 | 8/1975 | Perszyk | 328/134 |
| 3,971,994 | 7/1976 | Shepherd | 328/133 |
| 4,020,422 | 4/1977 | Underill | 328/133 |
| 4,128,811 | 12/1978 | Englund | 328/134 |
| 4,151,473 | 4/1979 | Coleman | 328/134 |
| 4,237,432 | 12/1980 | Rhodes | 328/133 |
| 4,277,754 | 7/1981 | Minakuchi | 328/133 |
| 4,278,903 | 7/1981 | Ichinose | 307/514 |

OTHER PUBLICATIONS

Breikss, Ivar, "Shift Register Simplifies Design of Phase Comparator", *Electronics*, Jan. 19, 1970, p. 93.

*Primary Examiner*—Siegfried H. Grimm
*Assistant Examiner*—David C. Mis
*Attorney, Agent, or Firm*—J. S. Tripoli; R. L. Troike; D. W. Phillion

[57] ABSTRACT

An improvement in a phase locked loop comprising a VCO for generating a signal $S_{VCO}$ of frequency $f_{VCO}$, a divider for dividing $f_{VCO}$ to produce a signal $S_N$ of frequency $f_N$, a reference signal generator for generating a reference signal $S_R$ of frequency $f_R$, and with said VCO responsive to a particular value $E_c$ of a variable control signal $e_c$ to cause $f_N = f_R$ for a given value of N, the improvement consisting of a phase/frequency detector for detecting and correcting frequency and phase differences between $S_N$ and $S_R$ to cause $f_N = f_R$ and comprising a three stage left/right shift register responsive to one of signals $S_N$ or $S_R$ to shift binary O's into the first stage thereof in the right direction and responsive to the other of signals $S_N$ or $S_R$ to shift binary 1's into the third stage thereof in the left direction. Also provided is a bit detector responsive to the 1's and 0's in the center stage of the shift register to produce a control signal $e_c$ either above or below $E_c$ when $f_N$ is greater or less than $f_R$. The VCO is responsive to the control signal $e_c$ to change the frequency $f_{VCO}$ of its output signal $S_{VCO}$ so that $f_N = f_R$ and $e_c = E_c$.

3 Claims, 4 Drawing Figures

PHASE FREQUENCY DETECTOR USING SHIFT REGISTER

This invention relates generally to phase/frequency detectors and more particularly to a phase/frequency detector in which the locking in of the desired frequency is independent of loop bandwidth.

Typical examples of the applications of phase/frequency detectors are digital frequency synthesizers, clock extractors and code tracking loops. Digital frequency synthesizers, for example, employ a voltage controlled oscillator (VCO) which supplies an output signal $S_{VCO}$ of a frequency $f_{VCO}$ to one input of a phase/frequency detector through a divide-by-N divider to produce an output signal $S_N$ of a frequency $f_N$. A reference signal $S_R$ of frequency $f_R$ is supplied to the other input of the phase/frequency detector which responds to such two input signals to supply a control signal $E_c$ back to the VCO through a loop filter. The control signal will cause the VCO to alter the frequency of its output signal so that after frequency division thereof it will equal the frequency of the reference signal ($f_N = f_R$).

The output of the VCO ordinarily constitutes the desired output frequency of the system and can be changed by changing the frequency dividing factor N. One of the difficulties present in such systems results from rapid changes of the division factor N which results in the control signal supplied from the phase detector having a high frequency beat component. Such high frequency beat component, in the absence of a loop filter, will cause rapid oscillations in the frequency of the output of the VCO and will prevent a lock-in of the system, i.e. the pull-in of the VCO output frequency to equal the frequency of the reference signal. A loop filter will minimize such high frequency components in the control signal supplied back to the VCO and permit pull-in of the VCO frequency to the desired frequency. On the other hand, the presence of the filter allows only a relatively small control signal to pass therethrough to the VCO. Accordingly, the VCO requires a relatively large amount of time to change its frequency in response to the relatively small control voltage allowed through the loop filter.

The present invention provides a phase/frequency detector which will produce a first constant amplitude control signal when the divided down frequency of the VCO output signal is less than the frequency of the reference signal and a second constant amplitude control signal when the divided down frequency of the VCO output signal is greater than the reference signal, thus permitting a large control signal to be supplied back to the VCO without broadening the bandwidth of the loop filter.

In accordance with a preferred embodiment of the invention, there is provided in a system comprising a voltage controlled oscillator (VCO) for generating a signal $S_{VCO}$ of frequency $f_{VCO}$, a divider for dividing $f_{VCO}$ to produce a signal $S_N$ of frequency $f_N$, and a reference signal generator for generating a reference signal $S_R$ of frequency $f_R$, and with said VCO responsive to a particular value $E_c$ of a variable control signal $e_c$ to cause $f_N = f_R$ for a given value of N, an improved phase/frequency detector for detecting and correcting frequency and phase differences between $S_N$ and $S_R$ to cause $f_N = f_R$ and comprising a three stage left/right shift register responsive to one signal of $S_N$ or $S_R$ to shift binary 0's into the first stage thereof in the right direction and responsive to the other signal of $S_N$ or $S_R$ to shift binary 1's into the third stage thereof in the left direction, and a bit detector responsive to the 1's and 0's in a center stage between the first and third stages of the shift register to produce a control signal $e_c$ either above or below $E_c$ when $f_N$ is greater or less than $f_R$. The VCO is responsive to the control signal $e_c$ to change the frequency $f_{VCO}$ of its output signal $S_{VCO}$ so that $f_N = f_R$ and $e_c = E_c$.

Figure 1:
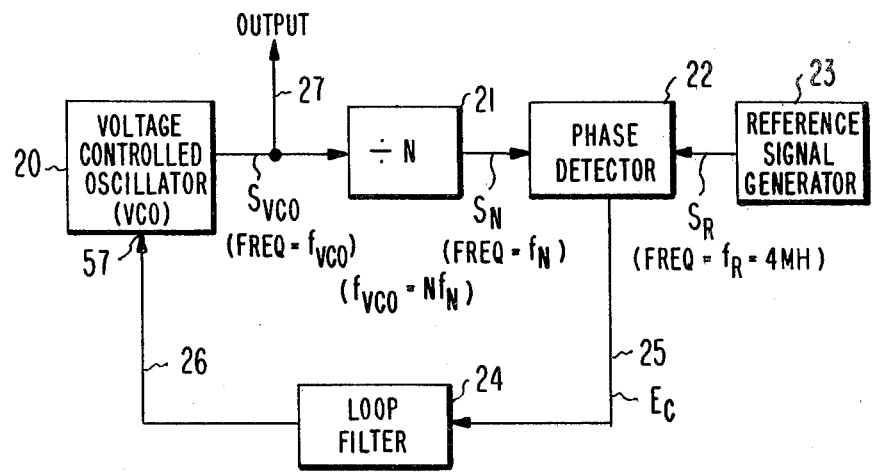
FIG. 1 is a block diagram of a prior art digital frequency synthesizer employing a phase detector.

Referring to the prior art structure shown in FIG. 1, the output $S_{VCO}$ of VCO 20 is supplied to a divider 21 which in turn supplies its output signal $S_N$ to one input of phase detector 22. The output signal $S_R$ of reference signal generator 23 is supplied to the other input of phase detector 22 which responds to the two signals supplied thereto to generate an output signal control signal $E_c$ which is supplied through lead 25, loop filter 24 and lead 26 to the frequency control input 57 of VCO 20. As a specific example, if the reference signal $S_R$ has a frequency $f_R = 4$ MHz and N has a value of 20 then the frequency of the output of VCO 20 must be 80 MHz ($20 \times 4$ MHz $= 80$ MHz). Such frequency is established by the control signal $E_c$ supplied from phase detector 22 through loop filter 24 and to the control input of VCO 20. If N is changed to a value of 5 then the output of the phase detector 22 will be such that VCO 20 will generate a signal having a frequency of 20 MHz ($5 \times 4$ MHz $= 20$ MHz). However, when N is changed from 20 to 5, a high frequency beat signal is generated in phase detector 22. More specifically, immediately after N is changed from 20 to 5 it will be dividing an output frequency from VCO 20 to 80 MHz so that $S_N$ will initially be equal to 16 MHz. Since the reference signal $S_R$ has a frequency of 4 MHz the difference frequency of 12 MHz will initially appear on output lead 25 from the phase detector 22. Such a high frequency beat frequency will not easily pass through the loop filter 24. Only the small d.c. component thereof will pass through loop filter 24 to which the VCO 20 will respond very slowly in altering its output frequency to the desired new value of 20 MHz.

Figure 2:
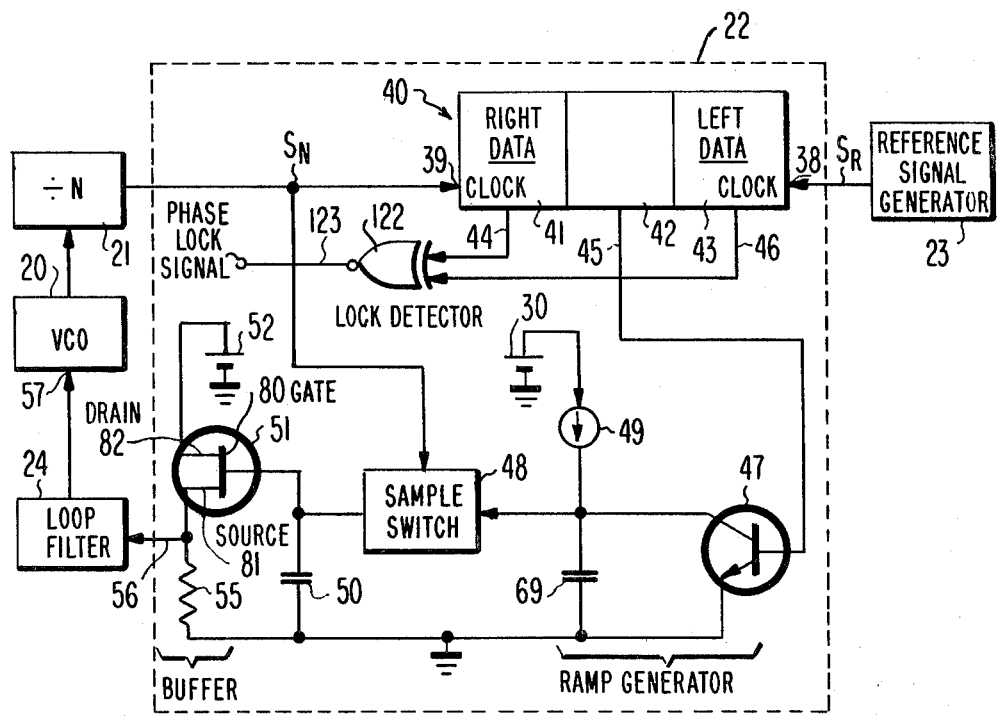
FIG. 2 is a combination schematic and block diagram of the present invention which can be employed in lieu of the phase detector shown in the synthesizer of FIG. 1.

In the circuit of FIG. 2 there is shown, within dashed block 22, the phase/frequency detector of the present invention. The signal $S_N$ is supplied from the divide-by-N logic 21 to the left-most clock input 39 of a 3 stage, left/right shift register 40 (a forward or reverse register) while the output signal $S_R$ of reference signal generator 23 is supplied to the right-most clock input 38 of the left/right shift register 40.

While it is arbitrary, the negative-going edges of each cycle of $S_N$ are designated as clocking 1's into the shift register 40 and in a direction going from left to right in FIG. 2. The negative-going edges of each cycle of the reference signal $S_R$ shift 0's into input 38 of the shift register which travel from right to left in the FIG. 2.

The contents of the center stage 42 of shift register 40 are supplied via lead 45 to the base of NPN transistor 47. More specifically, if the center stage 42 of register 40 contains binary 1's, transistor 47 becomes conductive so as to short circuit the capacitor 69 to ground. On the other hand, a binary 0 in stage 42 of shift register 40 will turn transistor 47 off to present a high impedance to capacitor 69 and thereby allow a charge to accumulate thereon from current generator 49 which is powered by battery 30. The accumulation of charge will cause a linearly increasing voltage to appear on capacitor 69 as shown in the curve of FIG. 3D.

Periodically, as shown in waveform A of FIG. 3 (to be discussed in detail later herein), at the negative-going edge of each cycle of $S_N$ the sampling switch 48 of FIG. 2 is caused to become conductive to transfer the voltage on capacitor 69 to capacitor 50. The voltage on capacitor 50 is then supplied to the gate electrode 80 of n-channel FET device 51 to cause FET device 51 to become conductive to a degree in accordance with the amplitude of the supplied voltage. A current flows from battery 52 through drain 82 and source 81 of FET device 51 and then through resistor 55 to produce a voltage on output lead 56 which, except for a small fixed offset, is proportional to the voltage on capacitor 50. Such output voltage is the control signal which is supplied through loop filter 24 to the control input 57 of VCO 20 in the manner described above re FIG. 1. The principal purpose of FET device 51 is to present a high impedance to capacitor 50 to prevent discharge thereof while at the same time using the voltage on capacitor 50 to control the current through device 51 and thus the voltage across resistor 55.

Figure 4:
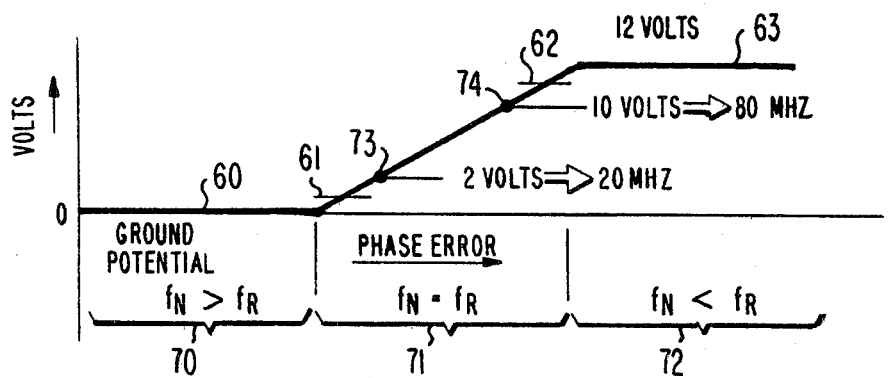
FIG. 4 is a composite phase/frequency characteristic curve of the invention.

Referring now to FIG. 4, there is shown the composite phase/frequency characteristic of the circuit of FIG. 2. The curve of FIG. 4 is divided into three sections, 70, 71 and 72. Section 70 shows the output signal on output lead 56 of FIG. 2 when the frequency $f_N$ of $S_N$ is greater than the frequency $f_R$ of $S_R$. As indicated above, the ground potential signal 60 shown in section 70 of FIG. 4 occurs as a result of the predominance of binary 1's being shifted to the right. This causes the center section 42 of register 40 (FIG. 2) to always be a logic 1 so that transistor 47 becomes conductive to allow the charge on capacitor 69 and the output of current generator 49 to flow directly to ground potential therethrough. When the sample switch 48 is made conductive the ground potential appearing across the capacitor 69 is transferred to capacitor 50 and then to gate 80 of FET device 51 to thereby make the control voltage on output lead 56 go to its minimum value, which is ground potential.

The high level section 72 of the curve of FIG. 4 is generated as a result of a predominance of 0's being shifted to the left so that the center section 42 of the three stage register 40 (FIG. 2) is always a logic 0. Such binary 0's cause transistor 47 to become non-conductive and thereby present a high impedance to capacitor 69. Such high impedance enables capacitor 69 to acquire a charge, the maximum value of such charge being equal to battery voltage 30 as shown in portion 63 of the curve of FIG. 4. Such voltage is transferred through sample switch 48, when enabled, to capacitor 50 to enable current flow through FET device 51 and thereby causing the voltage on output lead 56 to go to the maximum positive value.

When the frequency $f_N$ of $S_N$ becomes equal to the reference signal frequency $f_R$ the control signal appearing on output lead 56 of FIG. 2 will be somewhere between the ground potential section 70 of FIG. 4 and the high level potential section 72. More precisely the practical operating range of the system, after frequency lock-in, is between the points 61 and 62 of the center section 71 of the curve of FIG. 4 rather than the full range between ground potential and the maximum output voltage.

If the maximum output voltage is assumed to be 12 volts, as shown in section 72 of the curve of FIG. 4, the points 73 and 74 on the rising portion of section 71 of FIG. 4 represents two typical operating points. Specifically, point 73 shows a control voltage of two volts on output lead 56 of FIG. 2 which will cause VCO 20 to generate an output signal of 20 MHz. The point 74 shows an output voltage of 10 volts on output lead 56 of FIG. 2 which results in VCO 20 generating an output signal of 80 MHz.

The various voltages generated along the rising slope of section 71 of FIG. 4 are a direct result of phase differences between $S_N$ and $S_R$. Reference is made to waveforms of FIG. 3 which illustrate the foregoing. For convenience, such waveforms of FIG. 3 will be identified as waveform 3A or waveform 3B rather than waveform A of FIG. 3 or waveform B of FIG. 3.

The operation of the circuit when $f_N = f_R$ is as follows. At time $t_1$ the trailing edge 65 of $S_R$ (waveform 3A) will generate a 0 in the center stage 42 of shift register 40 of FIG. 2. Such 0 will cause transistor 47 to become non-conductive thereby allowing capacitor 69 to become charged as shown in the rising ramp 110 of waveform 3D. At time $t_2$ the leading edge 83 of pulse 84 of signal $S_N$ occurs, as shown in waveform 3B. For the duration of pulse 84 sample switch 68 (FIG. 2) will be enabled to allow the voltage on capacitor 69 to transfer to capacitor 50 and thereby control the current through device 51 and thus the voltage $E_c$ on lead 56.

Figure 3:
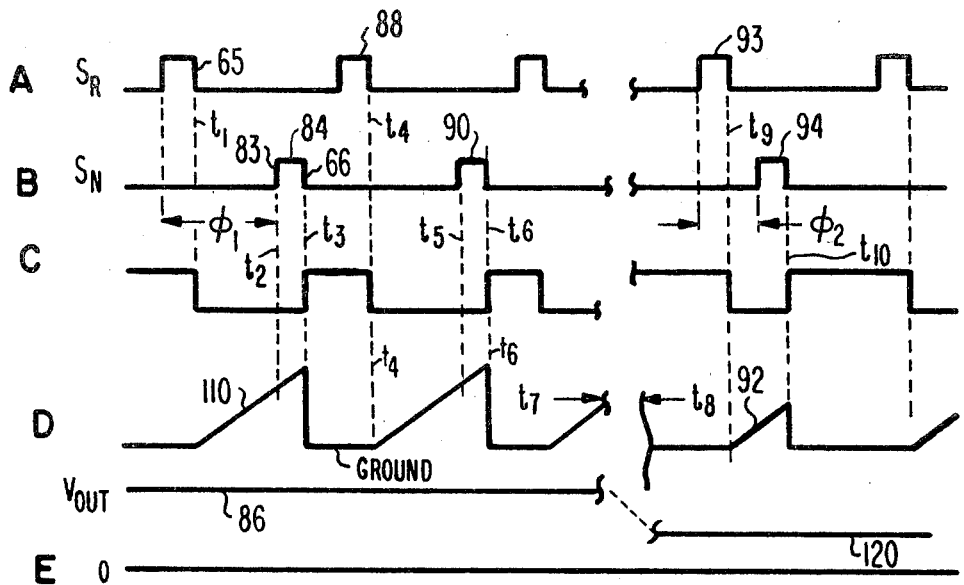
FIG. 3 is a set of waveforms showing the voltages appearing at various points in the structure of FIG. 2 during the operation thereof.

It is assumed that frequency lock-in has occurred prior to time $t_1$ in the waveforms of FIG. 3 and further that the phase relationship of $S_N$ and $S_R$ has been such as to produce a high level voltage on lead 56, as indicated by curve 86 of waveform 3E. For purposes of consistency of discussion assume that voltage level 86 is 10 volts so that VCO 20 of FIG. 2 is operating at 80 MHz with the phase relationship $\phi_1$ shown in waveforms 3A and 3B.

At time $t_3$ the negative-going edge 66 of pulse 84 of $S_N$ occurs. Such occurrence will clock a binary 1 into the first stage 41 of register 40 of FIG. 2. Since a 1 already existed in stage 41 a 1 will be shifted to the center stage 42. A 0 remains in the third stage 43 of register 40. The binary 1 in center stage 42 functions to make transistor 47 conductive so that the charge on capacitor 69 is rapidly discharged to ground through transistor 47. The charge on capacitor 69 will remain at ground potential between the times $t_3$ and $t_4$ since a binary 1 will be present in stage 42 of register 40 for such time interval. However, at time $t_4$ the trailing edge of pulse 88 of $S_R$, as shown in waveform 3A, occurs to shift a 0 into the center stage 42. Such binary 0 causes transistor 47 to become non-conductive, thereby allowing capacitor 69 to begin charging again by means of current generator 49. Such charging will continue between times $t_4$ and $t_6$ as shown in waveform 3D. At time $t_6$ the trailing edge of pulse 90 of $S_N$ occurs to again place a binary 1 in center stage 42 of register 40. Such binary 1 will, as discussed above, cause transistor 47 to become conductive to allow the charge on capacitor 69 to discharge to ground. It is to be noted that during the existence of pulse 90, i.e. from its leading to its trailing edge, the sample switch 48 is enabled to permit the voltage on capacitor 69 to be transferred to capacitor 50 before the capacitor 69 is discharged through transistor 47 to ground.

Assume now that during the time period $t_7$–$t_8$ of the waveforms of FIG. 3 many cycles of $S_N$ and $S_R$ have occurred while the two frequencies $f_N$ and $f_R$ are equal. Assume further that during the time period $t_7$–$t_8$, the value of N in divider 21 is changed to 5 so that the output of VCO must become 20 MHz in order for $S_N$ to be equal to $S_R$. Since the frequency of the output of VCO 20 must now become 20 MHz, it can be seen from waveform of FIG. 4 and as shown in portion 120 of waveform 3E, that the control voltage must decrease to 2 volts. Such decrease in control voltage is accomplished by a shift in phase between $S_N$ and $S_R$ to a value $\phi_2$ as shown in waveforms 3A and 3B. Because $\phi_2$ is less than $\phi_1$ the charge time of capacitor 69 between times $t_9$ and $t_{10}$ is less than the charge time for capacitor 69 between the times $t_1$ and $t_3$ when the phase difference was $\phi_1$.

Thus, in waveform 3D, the rising slope 92 represents the charging of the capacitor 69. Such charging begins at time $t_9$ when the trailing edge of pulse 93 of $S_R$ shifts a 0 into the center stage 42 of shift register 40, as discussed above. The charging of capacitor 69 terminates at time $t_{10}$ when the trailing edge of pulse 94 of $S_N$ occurs. The sampling of capacitor 69, which occurs between the leading and lagging edges of pulse 94 of waveform 3B results in a smaller voltage being transferred to capacitor 50. In the example given, such voltage will be 2 volts so that VCO 20 will generate an output signal having a frequency of 20 MHz.

Exclusive OR (XOR) gate 122 (FIG. 2) provides a phase lock signal indicating the system is in phase lock when line 44 is a logic 1 and line 46 is a logic 0 and is not in phase lock when lines 44 and 46 are both logic 1's or logic 0's.

Thus, XOR gate 122 provides a logic 1 on its output terminal 123 when the loop is phase locked and a logic 0 when the loop is unlocked.

What is claimed is:

1. In a system comprising a voltage-controlled oscillator (VCO) for generating a signal $S_{VCO}$ of frequency $f_{VCO}$, dividing means for dividing $f_{VCO}$ by N to produce a signal $S_N$ of frequency $f_N$ for a given value of N, a reference signal generator for generating a reference signal $S_R$ of frequency $f_R$, with said VCO responsive to a particular value $E_c$ of a variable control signal $e_c$ to cause $f_N=f_R$ for a given value of N, and a phase/frequency detector for detecting and correcting frequency and phase differences between $S_N$ and $S_R$ to cause $f_N=f_R$ and $e_c=E_c$, said phase/frequency detector comprising:

an M stage bi-directional shift register means having first and second input stages separated by at least one stage, said first input stage responsive to one of said signals $S_N$ and $S_R$ to shift binary 0's into the first input stage thereof in a first direction and said second input stage responsive to the other one of said signals $S_N$ and $S_R$ to shift binary 1's into the second input stage thereof in a second direction opposite said first direction; and bit detecting means responsive to binary 1's and 0's in a selected stage between said first and second stages to produce said control signal $e_c$ in a first or second voltage range either above or below $E_c$ when $f_N$ is respectively greater or less than $f_R$;

said VCO responsive to $e_c$ to change the frequency $f_{VCO}$ of its output signal $S_{VCO}$ so that $f_N=f_R$ and $e_c=E_c$;

said bit detecting means being further responsive to a bit of a given type contained in said selected stage of said shift register, after $f_N$ becomes equal to $f_R$, to generate a ramp signal of increasing amplitude whose peak amplitude lies between said first and second voltage ranges and is proportional to the length of time said bit of said given type remains in said selected stage during each cycle period of $f_N$;

said bit detecting means further comprising:

sample and hold means responsive to each cycle of one of said signals $S_N$ and $S_R$ to sample and hold the peak value of said ramp signal; and means responsive to the sampled and held ramp signal to produce said control signal $E_c$;

said VCO being further responsive to said control signal $E_c$ to generate $S_{VCO}$ having a phase such that $S_N$ will have a phase relationship with $S_R$ in accordance with the value of $E_c$.

2. In a system comprising a voltage controlled oscillator (VCO) having an output signal $S_{VCO}$ of frequency $f_{VCO}$ and responsive to a variable control voltage $e_c$ to change $f_{VCO}$, means for dividing $f_{VCO}$ by N to produce a signal $S_N$ of frequency $f_N$, a reference signal generator for generating a reference signal $S_R$ of frequency $f_R$, and a phase/frequency detector for detecting and adjusting frequency and phase differences between $S_N$ and $S_R$, said phase/frequency detector comprising:

a three stage bi-directional shift register means responsive to each cycle of $S_N$ to shift binary 1's into the first stage thereof in a first direction and responsive to each cycle of $S_R$ to shift binary 0's into the third stage thereof in a second direction;

first means responsive to a preponderance of either 0's or 1's in the second (center) stage of said shift register over a predetermined period of time to produce a first or a second value of said variable control voltage $e_c$, respectively, with said first value lying above and said second value lying below a range of operating values which includes specific values of $E_c$ of said variable control voltage $e_c$, where $E_c$ is the particular control voltage required to cause said VCO to generate an output frequency so that $f_N=f_R$;

said first means being further responsive to a binary 1 in the center stage of said bi-directional shift register during a portion of a cycle of $f_N$, and when $f_N=f_R$, to generate a ramp signal whose peak amplitude is proportional to the length of time said binary 1 remains in said center stage;

said first means further comprising:

sample means responsive to each cycle of $S_R$ to sample the peak amplitude of said ramp signal; and means responsive to said samples of said ramp signal to produce $e_c$;

said VCO being responsive to $e_c$ to change the phase of its output signal $S_{VCO}$ so that $f_N=f_R$ and $e_c=E_c$.

3. In a system comprising a voltage-controlled oscillator (VCO) for generating a signal $S_{VCO}$ of frequency $f_{VCO}$, dividing means for dividing $f_{VCO}$ by N to produce a signal $S_N$ of frequency $f_N$ for a given value of N, a reference signal generator for generating a reference signal $S_R$ of frequency $f_R$, with said VCO responsive to a particular value $E_c$ of a variable control signal $e_c$ to cause $f_N=f_R$ for a given value of N, and a phase/frequency detector for detecting and correcting frequency and phase differences between $S_N$ and $S_R$ to cause $f_N=f_R$ and $e_c=E_c$, said phase/frequency detector comprising:

an M stage bi-directional shift register means having first and second input stages separated by at least one stage, said first input stage responsive to one of said signals $S_N$ and $S_R$ to shift binary 0's into the first input stage thereof in a first direction and said second input stage responsive to the other one of said signals $S_N$ and $S_R$ to shift binary 1's into the second input stage thereof in a second direction opposite said first direction; and logic means responsive to binary 1's and 0's in a selected stage between said first and second stages to produce said control signal $e_c$ at a first or second constant voltage either above or below $E_c$ when $f_N$ is respectively greater or less than $f_R$;

said VCO being responsive to $e_c$ to change the frequency $f_{VCO}$ of its output signal $S_{VCO}$ so that $f_N=f_R$ and $e_c \doteq E_c$;

said logic means being further responsive to a bit of a given type contained in said selected stage of said shift register, after $f_N$ becomes equal to $f_R$, to generate a ramp signal of increasing amplitude whose peak amplitude lies between said first and second constant voltages and is proportional to the length of time said bit of said given type remains in said selected stage during each cycle period of $f_N$;

said logic means further comprising:

means responsive to the peak amplitude of said ramp signal during each of said cycle periods of $f_N$ to produce said control signal $E_c$;

said VCO being further responsive to $E_c$ to generate $S_{VCO}$ having a phase such that $S_N$ will have a phase relationship with $S_R$ in accordance with the value of $E_c$.

* * * * *